(12) United States Patent
Ning (10) Patent No.: US 12,092,685 B2
(45) Date of Patent: Sep. 17, 2024

(54) CHIP AND CHIP TEST SYSTEM (71) Applicant: Changxin Memory Technologies, Inc., Anhui (CN)

(72) Inventor: Shu-Liang Ning, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 830 days.

(21) Appl. No.: 17/211,366

(22) Filed: Mar. 24, 2021

(65) Prior Publication Data

US 2021/0208196 A1 Jul. 8, 2021

Related U.S. Application Data (63) Continuation of application No. PCT/CN2019/106358, filed on Sep. 18, 2019.

(30) Foreign Application Priority Data

Sep. 28, 2018 (CN) .......................... 201811137174.7
Sep. 28, 2018 (CN) .......................... 201821631053.3

(51) Int. Cl.
*G01R 31/28* (2006.01)
*G06F 30/333* (2020.01)

(52) U.S. Cl.
CPC ....... *G01R 31/2889* (2013.01); *G06F 30/333* (2020.01)

(58) Field of Classification Search
CPC . G11C 29/56012; G11C 29/48; G11C 29/023; G11C 29/14; G11C 2029/5602;
(Continued)

(56) References Cited

U.S. PATENT DOCUMENTS 5,982,685 A 11/1999 Kim
8,599,634 B1 12/2013 Lee et al.
(Continued)

FOREIGN PATENT DOCUMENTS

CN 1170877 A 1/1998
CN 1217546 A 5/1999
(Continued)

OTHER PUBLICATIONS

PCT International Search Report and the Written Opinion mailed Dec. 27, 2019, issued in related International Application No. PCT/CN2019/106358 (10 pages).
(Continued)

*Primary Examiner* — Eman A Alkafawi
*Assistant Examiner* — Suresh K Rajaputra
(74) *Attorney, Agent, or Firm* — Sheppard Mullin Richter & Hampton LLP (57) ABSTRACT

A chip and a chip test system are provided by the present invention. The chip includes a decoding module and a test mode control module, and decodes an input signal to determine whether the input signal is a pre-activation signal or not. If the input signal is decoded into a pre-activation signal, then the chip will respond to a subsequent test signal; otherwise, the chip will not respond to any subsequent test signal. According to the present invention, by configuring a pre-activation signal, the number of chips to be simultaneously connected to and individually tested by the test equipment can be increased, without the need to occupy more input/output (I/O) interfaces.

18 Claims, 5 Drawing Sheets

(58) Field of Classification Search
CPC ............ G01R 31/3172; G01R 31/2889; G06F 30/333
See application file for complete search history.

(56) References Cited

U.S. PATENT DOCUMENTS

| | | |
|---|---|---|
| 2006/0291307 A1 | 12/2006 | Fujioka et al. |
| 2008/0080268 A1 | 4/2008 | Ha et al. |
| 2009/0040849 A1* | 2/2009 | Mori ...................... G11C 29/02 365/201 |
| 2010/0074031 A1* | 3/2010 | Kim ...................... G11C 29/46 365/201 |
| 2012/0243355 A1 | 9/2012 | Shin et al. |
| 2012/0326775 A1 | 12/2012 | Heo |
| 2013/0073907 A1 | 3/2013 | Han |
| 2013/0162274 A1 | 6/2013 | Choi |
| 2016/0196857 A1 | 7/2016 | Lee |
| 2017/0084580 A1* | 3/2017 | Baek .............. G01R 31/318513 |
| 2018/0188324 A1 | 7/2018 | Lan et al. |

FOREIGN PATENT DOCUMENTS

| | | |
|---|---|---|
| CN | 1363935 A | 8/2002 |
| CN | 1815625 A | 8/2006 |
| CN | 101930527 A | 12/2010 |
| CN | 105067993 A | 11/2015 |
| CN | 109164374 A | 1/2019 |
| CN | 208953667 U | 6/2019 |

OTHER PUBLICATIONS

First Search dated Jul. 21, 2023, issued in related Chinese Patent Application No. 201811137174.7, with English machine translation (8 pages).

* cited by examiner

Fig. 11 ial Patent Application No. PCT/CN2019/106358, filed on
CHIP AND CHIP TEST SYSTEM

CROSS-REFERENCE TO RELATED APPLICATIONS

This application is a continuation application of International Patent Application No. PCT/CN2019/106358, filed on Sep. 18, 2019, which is based on and claims priority of the Chinese Patent Application Nos. 201811137174.7 and 201821631053.3, both filed on Sep. 28, 2018. The above-referenced applications are incorporated herein by reference in their entirety.

TECHNICAL FIELD

The present invention relates to the field of semiconductor technology, and in particular, to an integrated circuit (IC) chip and a test system capable of individually testing multiple such IC chips.

BACKGROUND

When multiple chips are tested in the related art, in order to implement individual test on each chip, usually, it is required to provide an individual chip select line for each chip.

Figure 1:
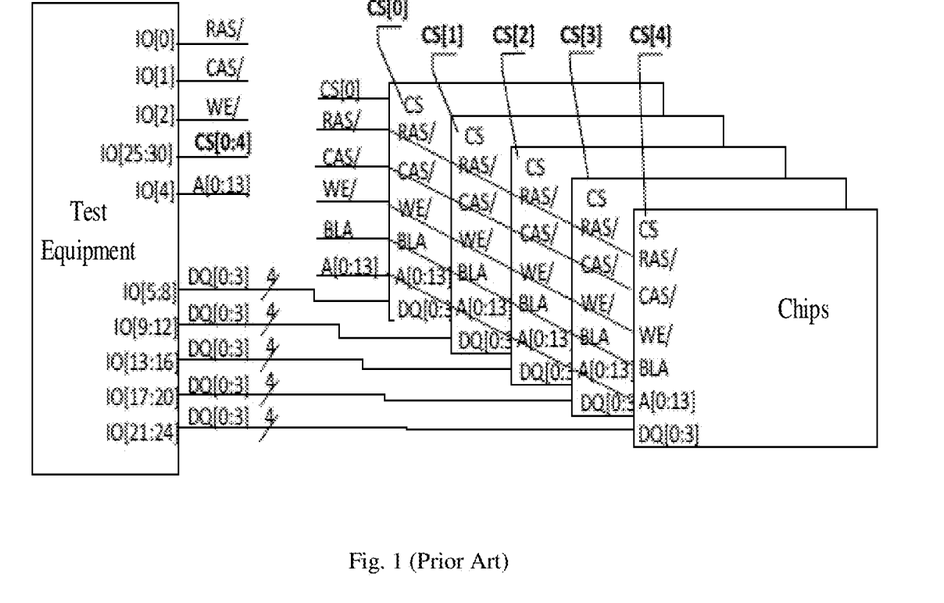
FIG. 1 is a schematic diagram of a test scenario for multiple chips in the related art.

FIG. 1 is a schematic diagram of a test scenario for multiple chips in the related art. Referring to FIG. 1, each of the five chips under test is provided with a chip select line occupying an individual input/output (I/O) interface. When limited number of I/O interfaces of a test equipment/test device are available, occupying the I/O interfaces for each of the chip select lines will reduce the test efficiency of the test equipment, and reduce the number of chips that can be tested by the test equipment at the same time.

Therefore, it is necessary to improve the test method for multiple chips/devices under test (DUTs), to increase the number of chips/DUTs that can be simultaneously connected to and tested by the test equipment, and thus to improve the test efficiency.

The information disclosed in this Background section is provided only for the purpose of facilitating the understanding of the background of the invention, and therefore may contain information that does not form the prior art already known to a person of ordinary skill in the art.

SUMMARY OF THE INVENTION

The present invention provides, in various embodiments, chips/DUTs and chip test systems, to overcome the problems of low number of chips/DUTs connected to a test equipment/test device due to the limitations and defects in the related art.

In one aspect, an embodiment of the present invention provides a chip coupled to a test equipment via a physical signal line and a data signal line. The chip may comprise:

a decoding module, which may be coupled to the physical signal line, and configured to decode a first input signal from the physical signal line and output a test mode signal or a test command signal, wherein the test mode signal may be generated before the test command signal;

a test mode control module, which may be coupled to the decoding module and the data signal line, and configured to set a test mode based on the test mode signal and a second input signal from the data signal line; and a test command execution module, which may be coupled to the decoding module, the test mode control module and the data signal line, wherein the test command execution module may be configured to respond to the test command signal based on the set test mode, or not to respond to the test command signal when no test mode is set.

In an embodiment of the present invention, the decoding module may comprise:

a design for test (DFT) decoding unit, which may comprise an input terminal coupled to the physical signal line and an output terminal including multiple sets of enable signal lines, and configured to decode the first input signal and output the test mode signal, wherein the test mode signal may comprise multiple sets of enable signals corresponding to multiple test modes, respectively; and a test command signal decoding unit, which may comprise an input terminal coupled to the physical signal line, and configured to decode the first input signal and output the test command signal.

In an embodiment of the present invention, each of the multiple sets of enable signals may comprise a first enable signal and a second enable signal, each of the multiple sets of enable signal lines may comprise a first enable signal line and a second enable signal line, and wherein the test mode control module may comprise:

multiple test mode enabling units, which may respectively correspond to the multiple test modes, wherein each of the multiple test mode enabling units may comprise:

a latch circuit, which may comprise an input terminal coupled to the first enable signal line and the data signal line, and configured to output a pre-activation signal based on the first enable signal and the second input signal; and an AND gate, which may comprise an input terminal coupled to the second enable signal line and an output terminal of the latch circuit, and configured to output a third enable signal corresponding to a respective test mode based on the second enable signal and the pre-activation signal.

In an embodiment of the present invention, the latch circuit may comprise:

a transmission gate, which may comprise a first control terminal coupled to the first enable signal line, a second control terminal coupled to the first enable signal line via a first inverter, and an input terminal coupled to the data signal line, the transmission gate may be configured to output the second input signal once the first enable signal reaches a predetermined level; and a second inverter, which may comprise an input terminal coupled to an output terminal of the transmission gate and an output terminal serving as an output terminal of the latch circuit, the second inverter may be configured to output an inversion of the second input signal serving as the pre-activation signal.

In an embodiment of the present invention, the input terminal of the latch circuit may be further coupled to a reset signal line, and the latch circuit may be further configured to output the pre-activation signal based on a predetermined reset signal.

In an embodiment of the present invention, the latch circuit may further comprise:

a NOR gate, which may comprise an input terminal coupled to the reset signal line and the output terminal of the latch circuit, and an output terminal coupled to the input terminal of the second inverter.

In an embodiment of the present invention, the test mode control module may be coupled to one of a plurality of data signal lines.

In an embodiment of the present invention, the test mode control module may set the test mode based on the third enable signal corresponding to each test mode.

In an embodiment of the present invention, the response of the test command execution module to the test command signal may comprise performing a Read/Write operation on the data signal line.

In an embodiment of the present invention, the physical signal line may comprise a control signal line, a chip select signal line, and an address signal line.

In another aspect, an embodiment of the present invention provides a chip test system, which may comprise:

a test equipment, which may comprise a plurality of physical signal lines and a plurality of data signal lines, and configured to output a test signal after the output of a pre-activation signal to a chip under test; and a plurality of chip test sites which may share the physical signal lines of the test equipment, each of the plurality of chip test sites coupled to the test equipment via a respective data signal line and to a chip as defined in any one of the foregoing paragraphs.

In an embodiment of the present invention, the physical signal line may comprise a control signal line, a chip select signal line and an address signal line.

In an embodiment of the present invention, the test equipment may be further configured to output the pre-activation signal to the chip under test while simultaneously outputting locking signals to all the other connected chips.

The chip provided in the embodiments of the present invention may comprise the decoding module and the test mode control module, and may decode an input signal to determine whether it is a pre-activation signal. If the input signal is decoded into a pre-activation signal, then the chip may respond to a subsequent test signal; otherwise, the chip may not respond to any subsequent test signal. By configuring a pre-activation signal, the number of chips to be simultaneously connected to and individually tested by the test equipment can be increased, without the need to occupy more I/O interfaces.

It is to be understood that both the foregoing summary and the following detailed description are exemplary and explanatory only and are not necessarily restrictive to the present invention.

BRIEF DESCRIPTION OF THE DRAWINGS

The accompanying drawings, which are incorporated in and constitute a part of the description, illustrate embodiments consistent with the present invention and, together with the description, serve to explain the principles of the present invention. It is apparent that these drawings present only some embodiments of the present invention, and those of ordinary skill in the art may obtain drawings of other embodiments from them without exerting any creative effort.

DETAILED DESCRIPTION

Exemplary embodiments will now be described in detail with reference to the accompanying drawings. However, these embodiments can be implemented in many forms and should not be construed as being limited to those set forth herein. Rather, these embodiments are presented to provide a full and thorough understanding of the present invention and to fully convey the concepts of the embodiments to others skilled in the art. In addition, the described features, structures, and characteristics may be combined in any suitable manner in one or more embodiments. In the following detailed description, many specific details are set forth to provide a more thorough understanding of the present invention. However, those skilled in the art will recognize that the various embodiments can be practiced without one or more of the specific details or with other methods, components, materials, or the like. In some instances, well-known structures, materials, or operations are not shown or not described in detail to prevent obscuring aspects of the embodiments.

Further, the annexed drawings are merely illustrative of the present invention. Throughout the figures, like reference numerals indicate identical or similar elements, so any duplicate description of them will be omitted. The represented blocks in the figures are purely functional entities, which do not necessarily correspond to physically separate entities. These functional entities may be implemented as software, or entirely or in part in one or more software-hardened modules, or in different networks and/or processor devices and/or microcontroller devices.

Exemplary embodiments of the present invention will be described in detail below with reference to the accompanying drawings.

Figure 2:
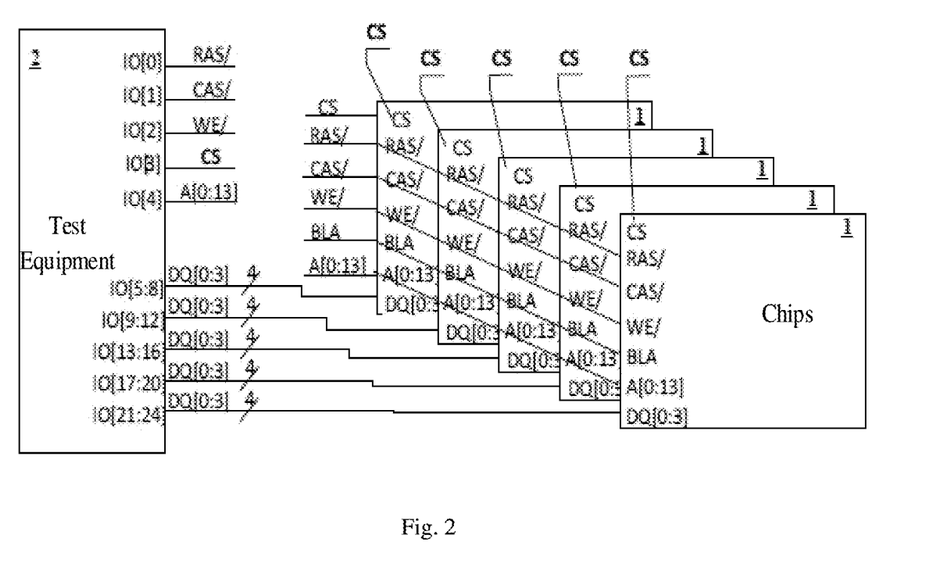
FIG. 2 is a schematic diagram of a chip test system in accordance with one embodiment of the present invention.

FIG. 2 is a schematic diagram of a chip test system in accordance with one embodiment of the present invention.

Referring to FIG. 2, each chip 1 provided by the present invention may be coupled to a test equipment 2 via a control signal line CMD, a chip select signal line CS, an address signal line ADD, and a data signal line DQ.

Figure 3:
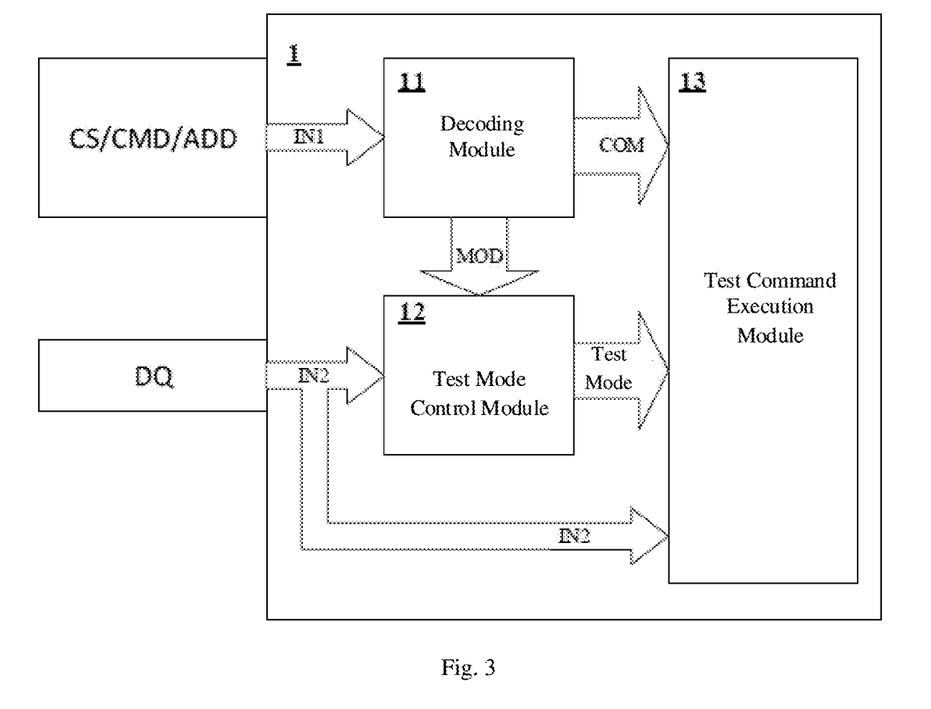
FIG. 3 is a block diagram of a chip in accordance with one embodiment of the present invention.

FIG. 3 is a block diagram of the chip in accordance with one embodiment of the present invention.

Referring to FIG. 3, in this embodiment of the present invention, the chip 1 may include:

a decoding module 11, which may be coupled to a physical signal line, and may be configured to decode a first input signal IN1 from the physical signal line and output a test mode signal MOD or a test command signal COM, and the test mode signal MOD may be generated before the test command signal COM;

a test mode control module 12, which may be coupled to the decoding module 11 and the data signal line DQ, and may be configured to set a test mode based on the test mode signal MOD and a second input signal IN2 from the data signal line DQ; and a test command execution module 13, which may be coupled to the decoding module 11, the test mode control module 12, and the data signal line DQ, and may be configured to respond to the test command signal COM based on the set test mode or not to respond to the test command signal COM when no test mode is set.

In the embodiment of FIG. 3, the physical signal line may include a control signal line CMD, a chip select signal line CS, and an address signal line ADD. In other embodiments, the physical signal line may be configured in a different way.

In the embodiments of the present invention, the first input signal IN1 may be decoded into the test mode signal MOD or the test command signal COM. For example, the decoding module 11 may first receive a first input signal IN1 to be decoded into the test mode signal MOD, and then receive a first input signal IN1 to be decoded into the test command signal COM.

Accordingly, when the first input signal IN1 is decoded into the test mode signal MOD, the second input signal IN2 from the data signal line DQ which comes together with the first input signal IN1, may be regarded as a pre-activation signal enabling the setting of test mode for the chip 1, or a locking signal disabling the setting of test mode for the chip 1. When the first input signal IN1 is decoded into the test command signal COM, the second input signal IN2 from the data signal line DQ which comes together with the first input signal IN1, may be regarded as a normal test data signal.

In one embodiment of the present invention, the test mode control module 12 may be coupled to one of a plurality of data signal lines DQ, for example, the first one. In this case, the second input signal IN2 may correspond to the first bit of the data signal. It may be configured that, when the second input signal IN2 is "1", the test mode control module 12 may set a test mode based on the test mode signal MOD and respond to the subsequent test command signal COM based on the set test mode; and when the second input signal is "0", the test mode control module 12 may neither set any test mode based on the test mode signal MOD nor respond to the subsequent test command signal COM. The foregoing manner in which the second input signal IN2 is configured is merely an example, and those of ordinary skill in the art can modify the bits and their corresponding meanings based on actual conditions, without departing from the scope of the present invention.

The test command execution module 13 may respond to the test command signal COM sent by the decoding module 11 based on the test mode set by the test mode control module 12. However, if the test mode control module 12 is not able to set any test mode under the control of the second input signal IN2, then the test command execution module 13 may not respond to the test command signal COM due to the absence of a test mode. In some embodiments, the response of the test command execution module 13 to the test command signal COM may include performing a Read/Write operation on the data signal line DQ based on the test command signal COM. The test command execution module 13 may include multiple sub-modules and respond to the test command signal COM in multiple ways, without departing from the scope of the present invention.

In addition to those described above, the chip 1 may further include other functional modules, such as a power module and a storage module. However, since these do not embody the key points of the present invention, they are not described in detail herein or labeled in the drawings.

By decoding the first input signals in advance to identify the test mode signals, and determining whether to set test modes and respond to the subsequent test command signals based on the concurring second input signals, multiple chips can be simultaneously tested with only chips under test responding to the test command signals, thus resulting in saving connections to the test equipment 2.

Figure 4:
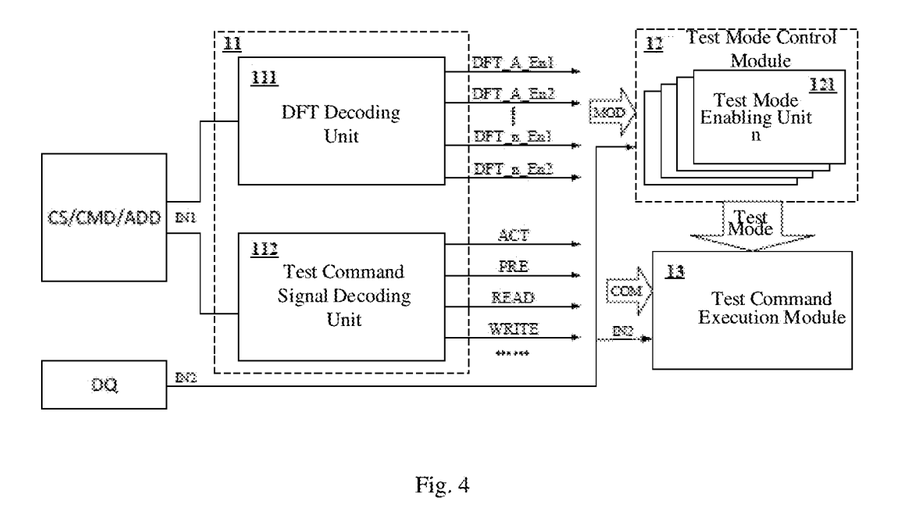
FIG. 4 is a schematic diagram of a decoding module in accordance with one embodiment of the present invention.

FIG. 4 is a schematic diagram of the decoding module in accordance with one embodiment of the present invention.

Referring to FIG. 4, in this embodiment of the present invention, the decoding module 11 may include:

a design for test (DFT) decoding unit 111, which may comprise an input terminal coupled to the control signal line CMD, the chip select signal line CS, and the address signal line ADD, and an output terminal including multiple sets of enable signal lines, and may be configured to decode the first input signal IN1 and output the test mode signal MOD, wherein the test mode signal MOD may include multiple sets of enable signals corresponding to multiple test modes; and a test command signal decoding unit 112, which may comprise an input terminal coupled to the control signal line CMD, the chip select signal line CS, and the address signal line ADD, may be configured to decode the first input signal IN1 and output the test command signal COM.

The input terminals of the DFT decoding unit 111 and of the test command signal decoding unit 112 may be configured to be wired in the same way, such that they may simultaneously receive and decode the first input signal IN1 from the control signal line CMD, the chip select signal line CS, and the address signal line ADD. Since the first input signal IN1 may be configured to serve different functions in different phases, only one of the DFT decoding unit 111 and the test command signal decoding unit 112 may decode the first input signal IN1 into valid data and outputting such data at a single time, while the data decoded by the others may be regarded as an invalid output. The first input signal IN1 may be decoded in various manners, without departing from the scope of the present invention.

By configuring two decoding units to decode the first input signal, different functions corresponding to the first input signal can be accurately identified, thus enabling more complicated and individual control of multiple chips multiplexing the same signal lines.

Figure 5:
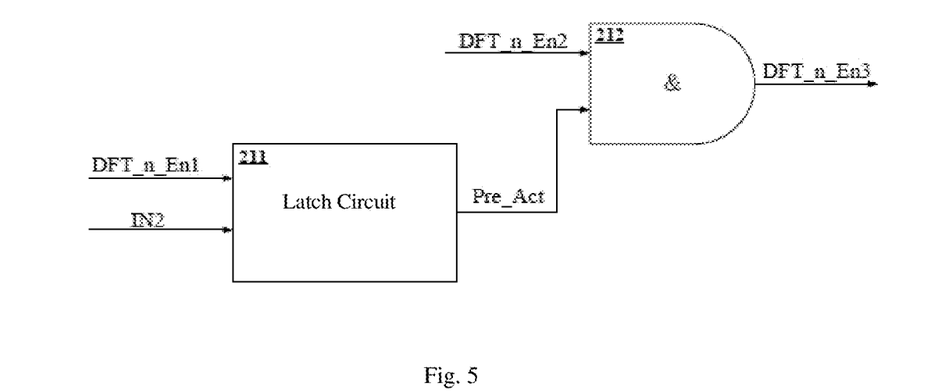
FIG. 5 is a schematic diagram of a test mode control module in accordance with one embodiment of the present invention.

FIG. 5 is a schematic diagram of the test mode control module in accordance with one embodiment of the present invention.

In the embodiments shown in FIG. 4 and FIG. 5, each of the multiple sets of enable signals may include a first enable signal DFT_n_En1 and a second enable signal DFT_n_En2. And each of the multiple sets of enable signal lines may include a first enable signal line and a second enable signal line. The test mode control module 12 may include:

multiple test mode enabling units 121, which may respectively correspond to the multiple test modes, wherein each of the test mode enabling units 121 may include:

a latch circuit 211, which may comprise an input terminal coupled to the first enable signal line and the data signal line DQ, and configured to output a pre-activation signal Pre_Act based on the first enable signal DFT_n_En1 and the second input signal IN2; and an AND gate 212, which may comprise an input terminal coupled to the second enable signal line and an output terminal of the latch circuit 211, and configured to output a third enable signal DFT_n_En3 corresponding to one of the multiple test modes based on the second enable signal DFT_n_En2 and the pre-activation signal Pre_Act.

In the embodiment shown in FIG. 5, each test mode may be controlled with two enable signals. The first enable signal DFT_n_En1 may enable the second input signal DFT_n_En2 to control the setting of the test mode, while the second enable signal DFT_n_En2 may act as a signal for enabling the test mode. In addition, the test mode control module 12 may be coupled to one of a plurality of data signal lines DQ, under such circumstance, all the multiple test mode enabling units 121 may be connected to the same data signal line DQ.

In the event that the first enable signal DFT_n_En1 is not in an enabling state, the second input signal IN2 will not be latched. Thus, the control of the test mode may be independently realized by the second enable signal DFT_n_En2. In this case, since the second enable signals DFT_n_En2 received by the chips 1 on the test equipment 2 may be identical, once the second enable signals DFT_n_En2 are in an enabling state, then the test mode enabling units 121 in the chips 1 on the test equipment 2 may output, under the control of the respective second enable signals DFT_n_En2, the third enable signals DFT_n_En3 which may enable the test modes corresponding to the respective second enable signals DFT_n_En2, and thus the response of the chips to subsequent test signals.

In the event that the first enable signal DFT_n_En1 is in an enabling state, the second input signal IN2 and the second enable signal DFT_n_En2 may work together to achieve the control of the test mode. In this case, if the second input signal IN2 is not in an enabling state, then the test mode enabling units 121 in the chips 1 may not output the third enable signals DFT_n_En3. As the test mode control module 12 is configured to set one of the test modes based on a third enable signal DFT_n_En3 corresponding to the test mode, no test mode may be set for the chip 1 in this case, and the chip may not respond to any subsequent test command signal COM.

In some embodiments of the present invention, the first enable signal DFT_n_En1 and the second enable signal DFT_n_En2 may be decoded from a single first input signal IN1. However, in some other embodiments of the present invention, the first enable signal DFT_n_En1 may be decoded firstly from an earlier first input signal IN1, then the second enable signal DFT_n_En2 may be decoded from a subsequent first input signal IN1.

By configuring two enable signals to control each test mode enabling unit, pre-activation of the chips may be blocked as needed. In this way, test modes can be simultaneously set for all the chips connected with the test equipment, and the chips are configured to respond to the subsequent test command signals. This eliminates the need to output extra enable signals by all the data lines when simultaneously testing multiple chips, thus resulting in an increase in control efficiency.

Figure 6:
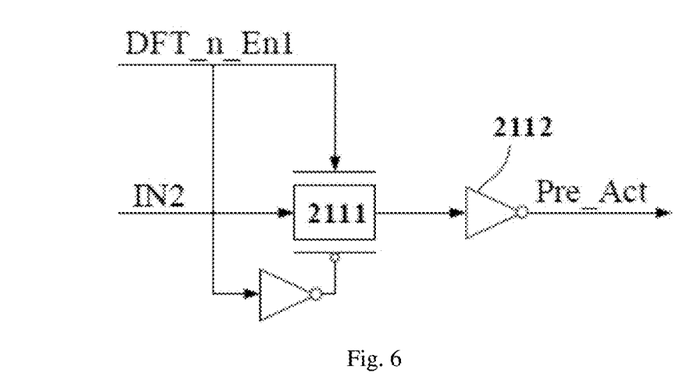
FIG. 6 is a schematic diagram of a latch circuit shown in FIG. 5.

FIG. 6 is a schematic diagram of the latch circuit shown in FIG. 5.

Referring to FIG. 6, in this embodiment of the present invention, the latch circuit 211 may include:
   a transmission gate 2111, which may comprise a first control terminal coupled to the first enable signal line, a second control terminal coupled to the first enable signal line via a first inverter, and an input terminal coupled to the data signal line DQ, and may be configured to output the second input signal IN2 once the first enable signal reaches a predetermined level; and
   a second inverter 2112, which may comprise an input terminal coupled to an output terminal of the transmission gate 2111 and an output terminal serving as an output terminal of the latch circuit 211, and be configured to output an inversion of the second input signal IN2 serving as the pre-activation signal.

In the embodiment shown in FIG. 6, the predetermined level may be a high level. In other embodiments, the predetermined level may be alternatively at a low level.

The control circuit shown in FIG. 6 allows validity control of the second input signal IN2 by the first enable signal DFT_n_En1. Although the latch circuit 211 in this embodiment has an inverter to achieve an inversion of the second input signal IN2, in alternative embodiments, those of ordinary skill in the art may designate the enable signals either as "1" or "0" according to the requirements of the various modules on these signals, and determine whether to add the inverter or not based on actual conditions. Moreover, the latch circuit may be implemented in various forms of hardware connection by those of ordinary skill in the art, without departing from the scope of the present invention.

Figure 7:
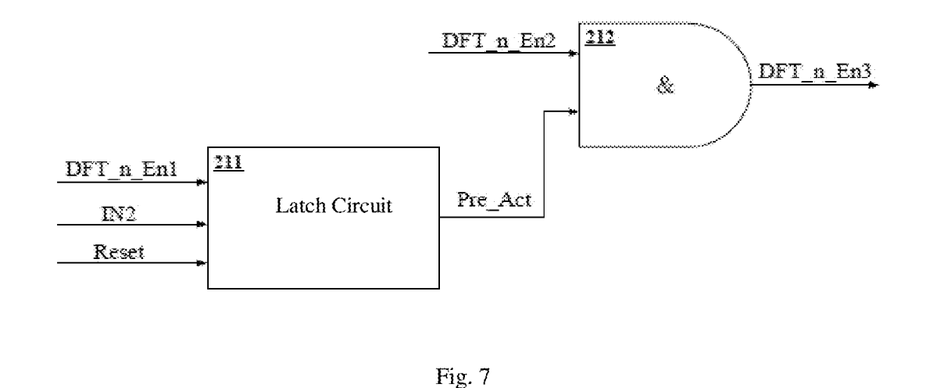
FIG. 7 is another schematic diagram of the test mode control module in accordance with one embodiment of the present invention.

FIG. 7 is another schematic diagram of the test mode control module in accordance with one embodiment of the present invention.

Figure 8:
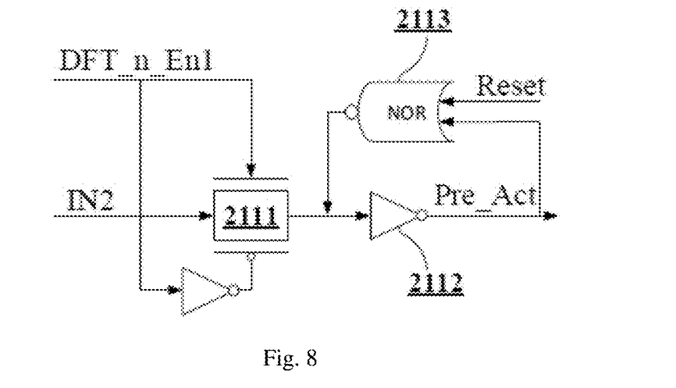
FIG. 8 is a schematic diagram of a latch circuit shown in FIG. 7.

FIG. 8 is a schematic diagram of the latch circuit shown in FIG. 7.

Referring to FIG. 7, according to this embodiment of the present invention, the input terminal of the latch circuit 211 may be further coupled to a reset signal line so that the latch circuit 211 is also under the control of a reset signal Reset. Accordingly, the latch circuit 211 may be further configured to output the pre-activation signal Pre_Act based on the predetermined reset signal Reset. When the reset signal Reset is at a high level, the pre-activation signal Pre_Act may always be output regardless of the state of the second input signal IN2. In this case, the setting of the test mode in the chip may be independently realized under the control of the second enable signal DFT_n_En2.

Referring to FIG. 8, in the embodiment of FIG. 7, the latch circuit 211 may further include a NOR gate 2113 compared to the one in the embodiment of FIG. 6. The NOR gate may comprise an input terminal coupled to the reset signal line and the output terminal of the latch circuit 211 (i.e., the output terminal of the second inverter 2112) and an output terminal coupled to the input terminal of the second inverter 2112.

By utilizing the reset signal Reset, all the chips may be placed under the independent control of the second enable signals DFT_n_En2, regardless of the configuring of the first enable signal DFT_n_En1 and the second input signal IN2, thus enhance the control efficiency.

Figure 9:
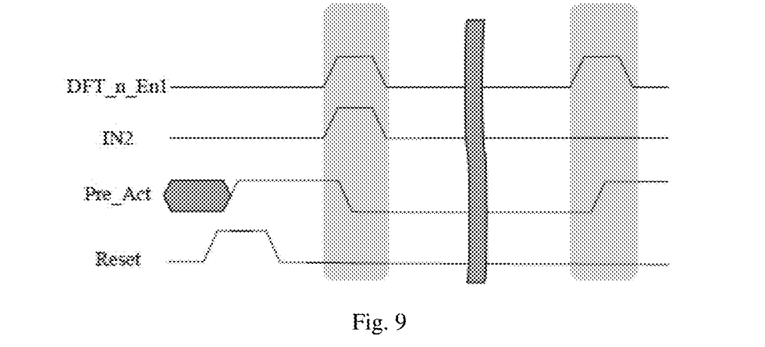
FIG. 9 is a schematic diagram of a control logic for the latch circuit shown in FIG. 7 and FIG. 8.

FIG. 9 is a schematic diagram of a control logic for the latch circuit shown in FIG. 7 and FIG. 8.

In the embodiment of FIG. 9, by default, the reset signal Reset is "1", the enabling state of the first enable signal DFT_n_En1 is "1", the pre-activation signal Pre_Act is "1". Further, the second input signal IN2 has one bit, and its enabling state is "0".

Referring to FIG. 9, following the occurrence of the reset signal Reset, the pre-activation signal Pre_Act may be output as "1".

When the first input signal IN1 is decoded into the test mode signal MOD, the first enable signal DFT_n_En1 may be brought into an enabling state. At this point, the second input signal IN2 may be in a disabling state of "1" which is output by the latch circuit 211. Then the pre-activation signal Pre_Act may become "0", and all the test mode enabling units 121 may be disabled. In this case, the chip is set with no test mode, and may not respond to any test command signal COM.

Upon the occurrence of the next first input signal IN1 to be decoded into the test mode signal COM, the first enable signal DFT_n_En1 may be brought into an enabling state. At this point, the second input signal IN2 may be in an enabling state of "0", and the pre-activation signal Pre_Act output from the latch circuit 211 may be in a state of "1", placing the test mode enabling units 121 of the chip 1 under the control of corresponding second enable signals DFT_n_En2. As a result, the chip may respond to the subsequent test command signal COM based on the set test mode.

Although several modules or units of devices for performing actions have been mentioned in the detailed description above, such division is not mandatory. Indeed, in accordance with embodiments of the present invention, the features and functions of two or more modules or units described above may be embodied in one module or unit. Conversely, the features and functions of one of the modules or units described above may be further divided into multiple modules or units.

Figure 10:
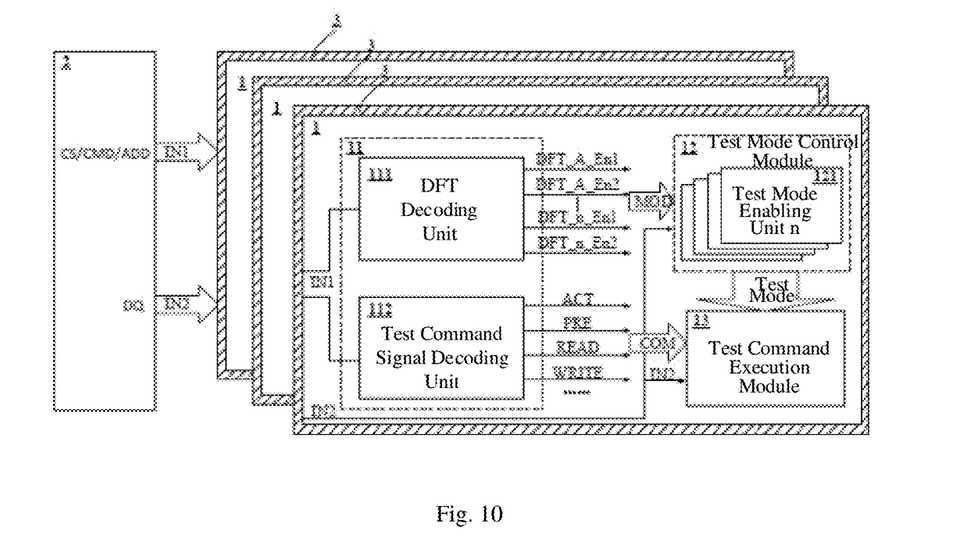
FIG. 10 is a schematic diagram of a test system in accordance with one embodiment of the present invention.

FIG. 10 is a schematic diagram of a chip test system in accordance with one embodiment of the present invention.

Referring to FIG. 10, in this embodiment of the present invention, the chip test system may include:

a test equipment 2, which may comprise a plurality of physical signal lines and a plurality of data signal lines DQ, and configured to output test signals to chips 1 after the output of pre-activation signals Pre_Act via a plurality of data signal lines DQ corresponding to the multiple chips 1; and a plurality of chip test sites 3 sharing the physical signal lines of the test equipment 2, each of which may be coupled to the test equipment 2 via a respective data signal line DQ, and to a corresponding chip 1 as shown in FIG. 2-FIG. 9.

In an embodiment of the present invention, the physical signal line may include a control signal line CMD, a chip select signal line CS, and an address signal line ADD.

In an embodiment of the present invention, the test equipment 2 may be further configured to output the pre-activation signals Pre_Act to the chips under test 1 while simultaneously outputting locking signals to all the other connected chips.

Figure 11:
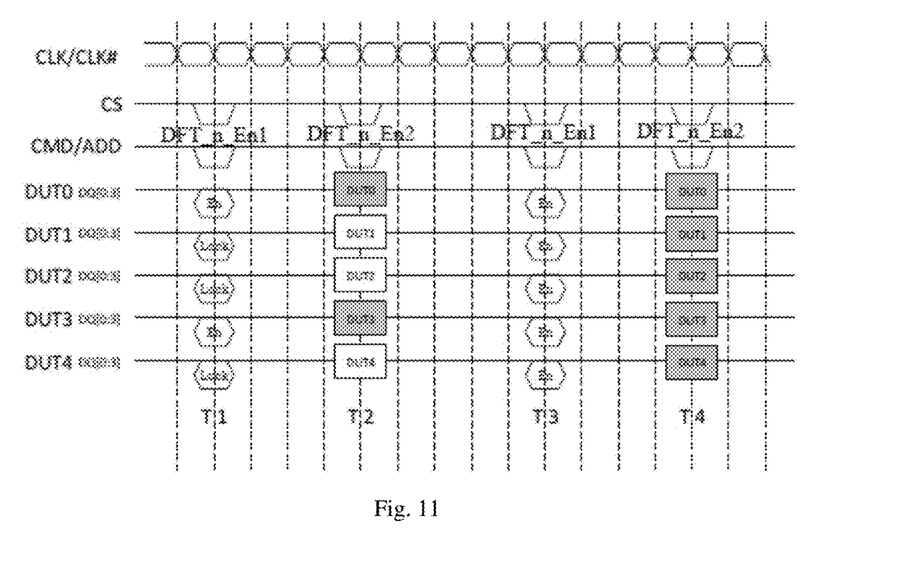
FIG. 11 is a timing diagram of control of a chip test system in accordance with one embodiment of the present invention.

FIG. 11 is a time diagram of control of the chip test system in accordance with one embodiment of the present invention.

Referring to FIG. 11, according to the wiring diagram shown in FIG. 10, when sending control signals, the test equipment may send, for all the chips, chip select signals to the chip select signal line CS, and signals to the control signal line CMD and the address signal line ADD.

As shown in FIG. 11, in a first phase T1, a signal may appear on each of the chip select signal line CS, the control signal line CMD, and the address signal line ADD. Such signal may be decoded by the decoding module 11 of each chip under test (DUT) into a first enable signal DFT_n_En1 corresponding to a test mode n. At the same time, second input signals IN2 appearing on the data signal lines DQ of the chips DUT0 and DUT3 may be in an enabling state and identified as pre-activation signals Pre_Act. Accordingly, the chips DUT0 and DUT3 may latch the pre-activation signals Pre_Act and respond in the next phase. On the other hand, none of the chips DUT1, DUT2, or DUT4 may output a pre-activation signal Pre_Act and thus may not respond to subsequent signals, unless and until the first enable signal DFT_n_En1 and the second input signal IN2 in an enabling state simultaneously appear afterwards.

In a second phase T2, each of the chips 1 may decode the first input signal IN1 into the second enable signal DFT_n_En2. At this point, since the latch circuits 211 in the chips DUT0 and DUT3 have latched the previous pre-activation signals Pre_Act, they may both output, under the action of the second enable signals DFT_n_En2, third enable signals DFT_n_En3 that enable the test mode n. As a result, the chips DUT0 and DUT3 may be set with the test mode n. Then the chips DUT0 and DUT3 may respond to the subsequent test command signals COM and perform an operation on data signals output via data signal lines DQ according to the test command signals COM.

In a third phase T3, the signals on the chip select signal line CS, the control signal line CMD and address signal line ADD may be decoded by the decoding modules 11 in the chips into first enable signals DFT_n_En1 corresponding to the test mode n. Meanwhile, second input signals IN2 on the data signal lines DQ connecting all the chips 1 may be in an enabling state and identified as pre-activation signals Pre_Act. Accordingly, the chips may latch the pre-activation signals Pre_Act and respond in the next phase.

In a fourth phase T4, each of the chips may decode the first input signals IN1 into the second enable signals DFT_n_En2. Since the latch circuits 211 in the chips have latched the previous pre-activation signals Pre_Act, they may output, under the action of the second enable signals DFT_n_En2, third enable signals DFT_n_En3 that enable the test mode n. As a result, each of the chips 1 may be set with the test mode n. Then the chips 1 may respond to the subsequent test command signals COM and perform an operation on data signals output via data signal lines DQ according to the test command signals COM.

In some embodiments, the third phase T3 and fourth phase T4 may occur during a power up or restart of the chips.

By sending pre-activation signals corresponding to chips under test during the individual test of multiple chips that multiplex a plurality of signal lines, chips under test may be instructed to respond or not to respond to subsequent test command signals based on the pre-activation signals. In this way, the number of chips to be simultaneously tested by the test equipment can be increased, without the need to occupy extra I/O interfaces of the test equipment, thus resulting in an increase in chip testing efficiency.

As will be appreciated by one skilled in the art, various aspects of the present invention may be embodied as a system, a method or a program product. Accordingly, various aspects of the present invention may take the form of an entire hardware embodiment, an entire software embodiment (including firmware, micro-code, etc.) or an embodiment combining software and hardware aspects that may all generally be referred to herein as a "circuit", "module" or "system".

Further, the accompanying drawings are merely illustrative of a series of processes included in the method according to embodiments of the present invention and are not intended to be restrictive. It will be readily appreciated that the way in which the processes are illustrated does not indicate any chronological order of them or limit them to a particular chronological order. Furthermore, it will also be readily appreciated that the processes may be performed, for example, synchronously or asynchronously in multiple modules.

Other embodiments of the present invention will be apparent to those skilled in the art from considering the specification and practicing the invention disclosed herein. Accordingly, this invention is intended to cover all and any variations, uses, or adaptations of the invention which follow, in general, the principles thereof and include such departures from the present invention as come within common knowledge or customary practice within the art to which the invention pertains. It is also intended that the specification and examples be considered as exemplary only, with the true scope and spirit of the invention being indicated by the appended claims.

What is claimed is:

1. A chip, coupled to a test equipment via a physical signal line and a data signal line, the chip comprising:
    a decoding circuit, coupled to the physical signal line, and configured to decode a first input signal from the physical signal line and output a test mode signal or a test command signal, wherein the test mode signal is generated before the test command signal;
    a test mode control circuit, coupled to the decoding circuit and the data signal line, and configured to set a test mode based on the test mode signal and a second input signal from the data signal line; and
    a test command execution circuit, directly coupled to the decoding circuit, the test mode control circuit, and the data signal line, wherein the test command execution circuit is configured to respond to the test command signal based on the set test mode, and not to respond to the test command signal when no test mode is set.

2. The chip of claim 1, wherein the decoding circuit comprises:
    a design for test (DFT) decoding circuit, comprising an input terminal coupled to the physical signal line and an output terminal including a plurality of sets of enable signal lines, the DFT configured to decode the first input signal and output the test mode signal, wherein the test mode signal comprises a plurality of sets of enable signals corresponding to a plurality of test modes, respectively; and
    a test command signal decoding circuit, comprising an input terminal coupled to the physical signal line, and configured to decode the first input signal and output the test command signal.

3. The chip of claim 2, wherein each of the plurality of sets of enable signals comprises a first enable signal and a second enable signal, wherein each of the plurality of sets of enable signal lines comprises a first enable signal line and a second enable signal line, and wherein the test mode control circuit comprises:
    a plurality of test mode enabling circuits, which respectively correspond to the plurality of test modes, wherein each of the plurality of test mode enabling circuits comprising:
    a latch circuit, comprising an input terminal coupled to the first enable signal line and the data signal line, and configured to output a pre-activation signal based on the first enable signal and the second input signal; and
    an AND gate, comprising an input terminal coupled to the second enable signal line and an output terminal of the latch circuit, and configured to output a third enable signal corresponding to a respective test mode based on the second enable signal and the pre-activation signal.

4. The chip of claim 3, wherein the latch circuit comprises:
    a transmission gate, comprising a first control terminal coupled to the first enable signal line, a second control terminal coupled to the first enable signal line via a first inverter, and an input terminal coupled to the data signal line, the transmission gate configured to output the second input signal once the first enable signal reaches a predetermined level; and
    a second inverter, comprising an input terminal coupled to an output terminal of the transmission gate and an output terminal serving as an output terminal of the latch circuit, the second inverter configured to output an inversion of the second input signal serving as the pre-activation signal.

5. The chip of claim 4, wherein the input terminal of the latch circuit is further coupled to a reset signal line, and the latch circuit is further configured to output the pre-activation signal based on a predetermined reset signal.

6. The chip of claim 5, wherein the latch circuit further comprises:
    a NOR gate comprising a first input terminal coupled to the reset signal line and a second input terminal coupled to the output terminal of the latch circuit, and an output terminal coupled to the input terminal of the second inverter.

7. The chip of claim 1, wherein the test mode control circuit is coupled to one of a plurality of data signal lines.

8. The chip of claim 3, wherein the test mode control circuit sets the test mode based on the third enable signal corresponding to each test mode.

9. The chip of claim 1, wherein a response of the test command execution circuit to the test command signal comprises performing a Read/Write operation on the data signal line.

10. The chip of claim 1, wherein the physical signal line comprises a control signal line, a chip select signal line and an address signal line.

11. A chip test system, comprising:
    a test equipment, comprising a plurality of physical signal lines and a plurality of data signal lines, and configured to output a test signal after the output of a pre-activation signal to a chip under test; and
    a plurality of chip test sites sharing the physical signal lines of the test equipment, wherein each of the plurality of chip test sites coupled to the test equipment via a respective data signal line and to a chip, wherein the chip comprises:
    a decoding circuit, coupled to one of the physical signal lines, and configured to decode a first input signal from the one of the physical signal lines and output a test mode signal or a test command signal, wherein the test mode signal is generated before the test command signal;
    a test mode control circuit, coupled to the decoding circuit and the data signal line, and configured to set a test mode based on the test mode signal and a second input signal from the data signal line; and
    a test command execution circuit, directly coupled to the decoding circuit, the test mode control circuit, and the data signal line, wherein the test command execution circuit is configured to respond to the test command signal based on the set test mode, and not to respond to the test command signal when no test mode is set.

12. The chip test system of claim 11, wherein the one of the physical signal lines comprises a control signal line, a chip select signal line and an address signal line.

13. The chip test system of claim 11, wherein the test equipment is further configured to output the pre-activation signal to the chip under test while simultaneously outputting locking signals to all the other connected chips other than the chip under test.

14. The chip test system of claim 11, wherein the first input signal is decoded as the test mode signal and/or the test command signal, wherein the test mode signal comprises a plurality of sets of enable signals corresponding to a plurality of test modes, respectively.

15. The chip test system of claim 14, wherein each of the plurality of sets of enable signals comprises a first enable signal and a second enable signal, a pre-activation signal is generated according to at least the first enable signal and the second input signal, and a third enable signal corresponding to a respective test mode is generated according to at least the second enable signal and the pre-activation signal.

16. The chip test system of claim 15, wherein the pre-activation signal is generated according to a predetermined reset signal.

17. The chip test system of claim 15, wherein the test mode is set based on at least the third enable signal corresponding to each test mode.

18. The chip test system of claim 11, wherein, in response to the test command signal, a Read/Write operation is performed on the data signal line.

* * * * *